(12) United States Patent
Grosser, III et al.

(10) Patent No.: US 9,466,231 B2
(45) Date of Patent: Oct. 11, 2016

(54) SOLAR POWERED ILLUMINATED SIGN

(71) Applicants: Earl Edwin Grosser, III, Halifax, PA (US); Eugene Sherman Taylor, Elizabethville, PA (US)

(72) Inventors: Earl Edwin Grosser, III, Halifax, PA (US); Eugene Sherman Taylor, Elizabethville, PA (US)

( * ) Notice: Subject to any disclaimer, the term of this patent is extended or adjusted under 35 U.S.C. 154(b) by 2 days.

(21) Appl. No.: 14/664,656

(22) Filed: Mar. 20, 2015

(65) Prior Publication Data
US 2015/0269876 A1 Sep. 24, 2015

Related U.S. Application Data

(60) Provisional application No. 61/969,669, filed on Mar. 24, 2014.

(51) Int. Cl.
| | |
|---|---|
| *G09F 13/00* | (2006.01) |
| *G09F 13/12* | (2006.01) |
| *G09F 13/04* | (2006.01) |
| *H01L 31/042* | (2014.01) |
| *G09F 27/00* | (2006.01) |
| *G09F 13/08* | (2006.01) |
| *G09F 13/14* | (2006.01) |
| *G09F 13/22* | (2006.01) |

(52) U.S. Cl.
CPC ........... *G09F 13/12* (2013.01); *G09F 13/0413* (2013.01); *G09F 13/08* (2013.01); *G09F 13/14* (2013.01); *G09F 27/007* (2013.01); *H01L 31/042* (2013.01); *G09F 2013/049* (2013.01); *G09F 2013/0418* (2013.01); *G09F 2013/222* (2013.01); *Y02E 10/52* (2013.01)

(58) Field of Classification Search
CPC .................. G09F 13/04; G09F 13/14; G09F 2013/0454; G09F 13/00; G09F 13/08
See application file for complete search history.

(56) References Cited

U.S. PATENT DOCUMENTS

| | | | | |
|---|---|---|---|---|
| 3,997,991 A * | 12/1976 | Hayman-Chaffey | ... | G09F 13/10 40/361 |
| 6,367,180 B2 * | 4/2002 | Weiss | ... | G09F 13/0409 40/544 |
| 7,134,764 B1 * | 11/2006 | Bieberdorf | ... | B64F 1/18 362/153 |
| 2005/0030764 A1 * | 2/2005 | Spero | ... | G02B 6/0086 362/559 |
| 2008/0276507 A1 * | 11/2008 | Hines | ... | G09F 19/22 40/541 |
| 2011/0023338 A1 * | 2/2011 | Ellerton | ... | G08G 5/065 40/564 |
| 2014/0197955 A1 * | 7/2014 | Martin | ... | G08B 5/36 340/584 |

\* cited by examiner

*Primary Examiner* — Cassandra Davis
(74) *Attorney, Agent, or Firm* — Dunlap Bennett & Ludwig PLLC

(57) ABSTRACT

A solar powered sign is provided. The solar powered sign may include a panel frame. The panel frame includes an inner surface forming an inner housing, and at least one rim forming an opening leading into the housing. A translucent panel covers the opening of the panel frame. The present invention further includes internal components. The internal components may include at least one support rod and a plurality of lights. The support rod of the present invention includes a mirrored outer surface and the plurality of lights are disposed within the housing to emit light towards the support rod. The present invention further includes a solar panel electrically powering the plurality of lights.

12 Claims, 5 Drawing Sheets

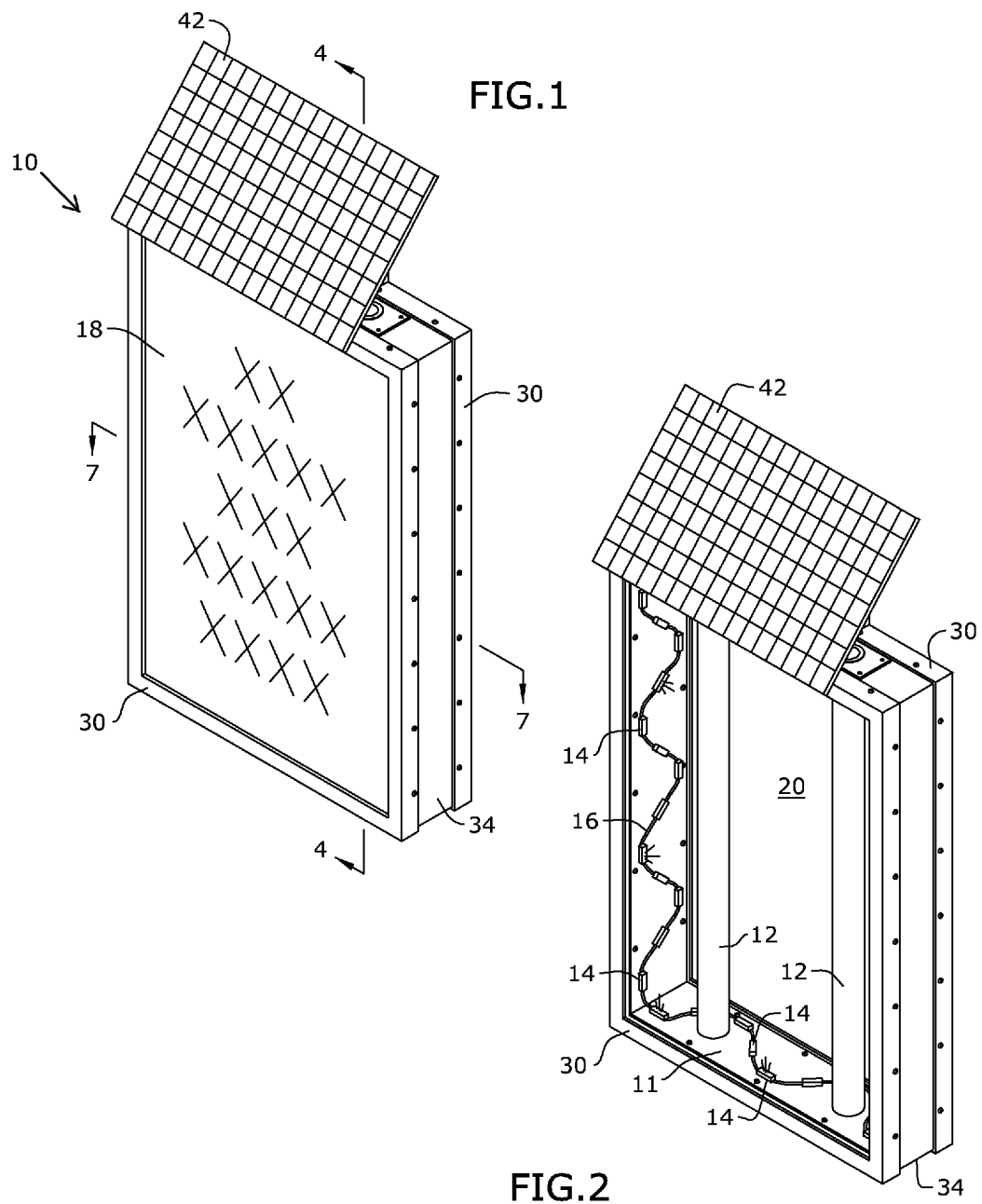

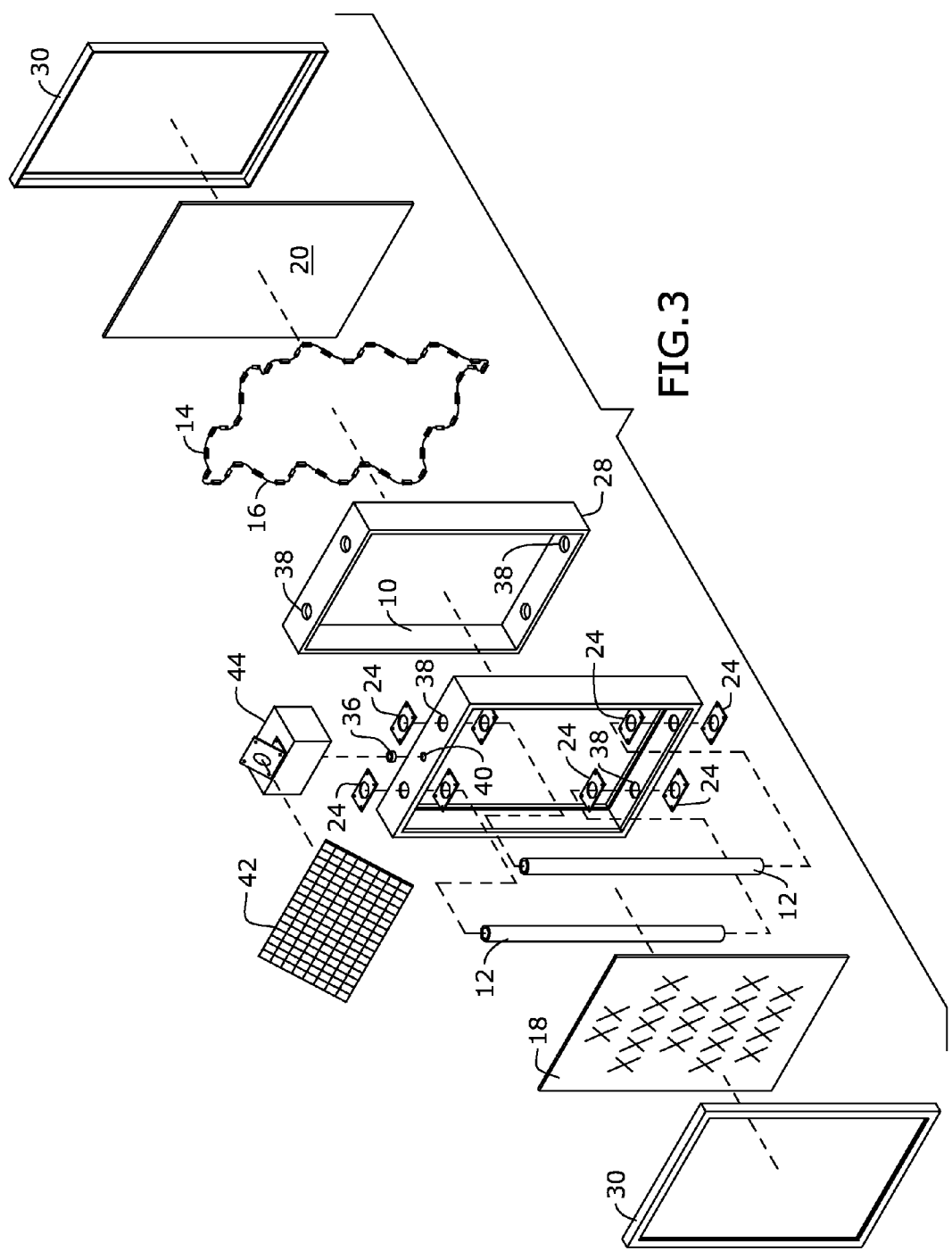

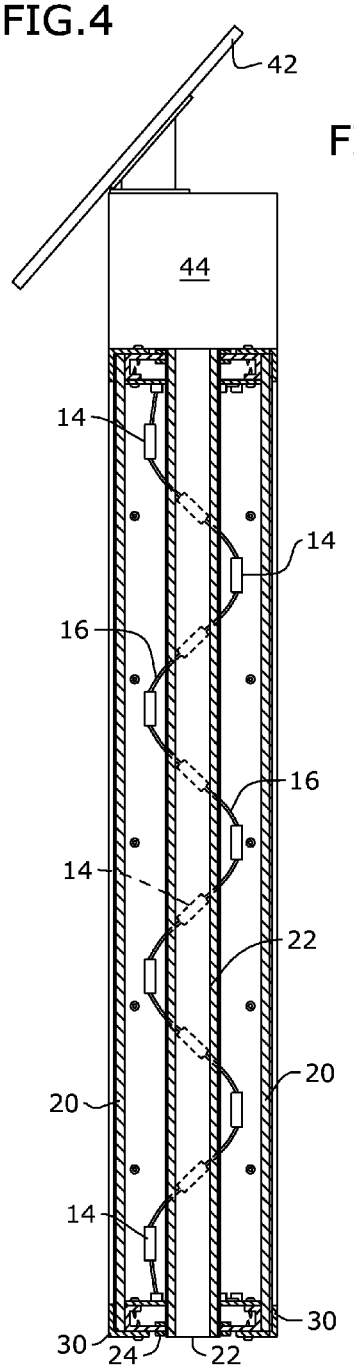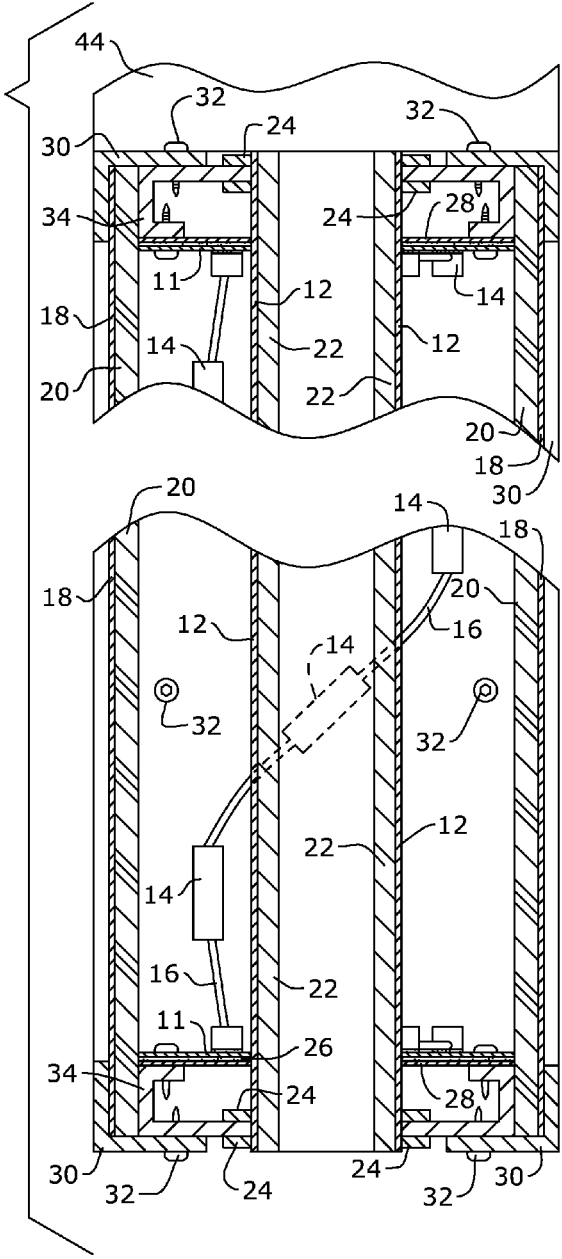

SOLAR POWERED ILLUMINATED SIGN

CROSS-REFERENCE TO RELATED APPLICATION

This application claims the benefit of priority of U.S. provisional application No. 61/969,669, filed Mar. 24, 2014, the contents of which are herein incorporated by reference.

BACKGROUND OF THE INVENTION

The present invention relates to illuminated signs and, more particularly, to solar powered illuminated signs.

Lighted signs are popular for businesses in order for the business to display their name or logo even during the night hours. Current lighted signs are typically connected to the electrical grid as opposed to being powered by renewable energy. This is because the signs require the use of energy beyond that which is produced by current renewable energy generators.

As can be seen, there is a need for an improved lighted sign powered by renewable energy.

SUMMARY OF THE INVENTION

In one aspect of the present invention, a solar powered sign comprises: a panel frame comprising an outer surface, an inner surface forming an inner housing, and at least one rim forming an opening into the inner housing, wherein the inner surface of the panel frame is at least partially mirrored; a translucent panel covering the opening of the panel frame; a plurality of lights operable to emit light towards a mirrored portion of the inner surface; and a solar panel electrically powering the plurality of lights.

These and other features, aspects and advantages of the present invention will become better understood with reference to the following drawings, description and claims.

BRIEF DESCRIPTION OF THE DRAWINGS

FIG. 1 is a perspective view of an embodiment of the present invention;

FIG. 2 is a perspective view of the present invention shown without the sign panel to illustrate internal components;

FIG. 3 is an exploded view of the present invention;

FIG. 4 is a section view taken from 4-4 in FIG. 1;

FIG. 5 is an enlarged section view of the present invention;

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

The present invention includes internally lighted signs powered by a solar source. The present invention may utilize DC LEDs to light up sign boxes. This allows the option of signs to be placed anywhere regardless of access to the power grid. Further, the present invention uses less wattage to produce more lumens and less sun is needed to maintain the lumens. By using less LED's, the battery backup time is extended significantly.

The solar panel collects the suns energy through an inline diode to keep from back drawing the current from the battery after the sun goes down. The energy coming from the panel goes into the solar charge controller which reduces the amount of volts and increases the amps coming from the panel to a sufficient enough amount of energy to sustain a 12V Marine Deep Cycle battery to maintain the lighting capacity of the sign box. The Deep Cycle battery transfers power through the inline fuse or breaker to the photocell or timer. The photocell or timer transfers power to the LED modules which reflect lumens off of the unique mirroring system to create a bright low watt sign box.

Figure 6:
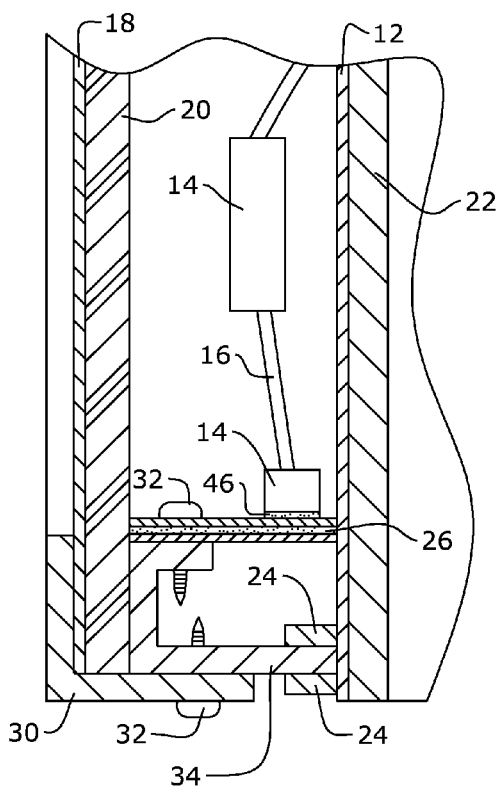
FIG. 6 is an enlarged section view of the present invention.
Figure 8:
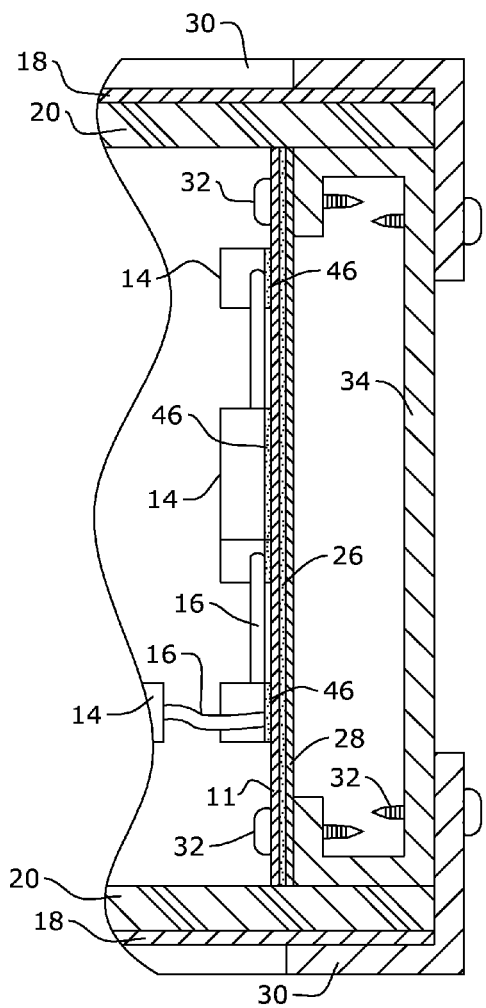
FIG. 8 is an enlarged section view of the present invention.
Figure 7:
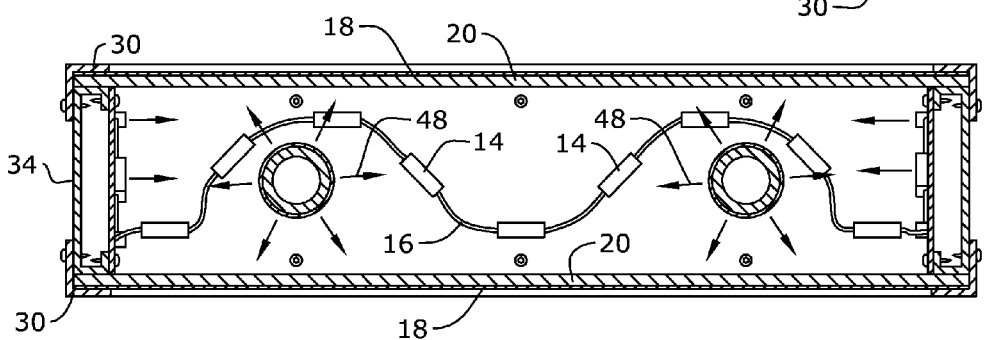
FIG. 7 is a section view taken from 7-7 in FIG. 1.
Figure 9:
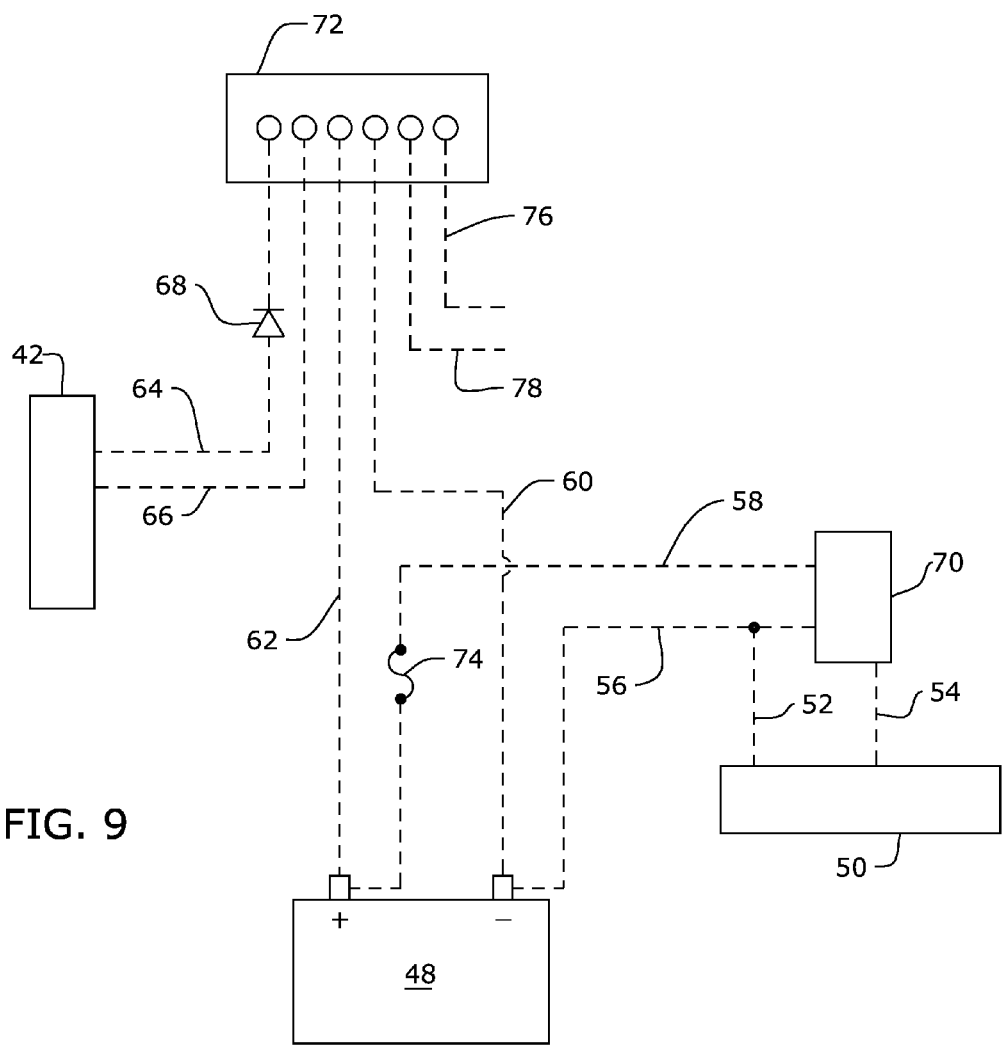
FIG. 9 is a schematic view of an embodiment of the electrical system.

Referring to FIGS. 1 through 9, the present invention includes a solar powered sign 10. The solar powered sign 10 may include a panel frame 28. The panel frame 28 includes an inner surface forming an inner housing, and at least one rim forming an opening leading into the housing. A translucent panel 18 covers the opening of the panel frame 28. The present invention further includes internal components. The internal components may include at least one support rod 22 and a plurality of lights 14. The support rod 22 of the present invention includes a mirrored outer surface 12 and the plurality of lights 14 are disposed within the housing to emit light towards the support rod 22. The present invention further includes a solar panel 42 electrically powering the plurality of lights 14.

In certain embodiments, the present invention includes an outer frame 34 or sign frame. The panel frame 28 is secured within the outer frame 24 by fasteners 32, such as self tapping screws, bolts and the like. The translucent panel 18 may be attached to the outer frame 34 by corner brackets 30. The corner brackets 30 may be fastened to the outer frame 34 by fasteners 32 and the translucent panel 18 may be sandwiched to the outer frame 24 by a retaining lip formed on the corner brackets 30.

The translucent panel 18 of the present invention may have a text or design printed on its surface, forming a translucent sign. In certain embodiments, the present invention may further include an acrylic sheet 20 as a backing for the translucent panel 18. The acrylic sheet 20 may be secured in between the translucent panel 18 and the outer frame 34. In certain embodiments, the panel frame 28 and the outer frame 34 may include a front rim and a rear rim, forming openings on opposite sides. In such embodiments, the present invention may include a first translucent panel 18 with an acrylic sheet 20 attached to the front rim, and a second translucent panel 18 with an acrylic sheet 20 attached to the rear rim. Therefore, translucent panels 18 may be displayed on opposing sides of the solar powered sign 10.

The plurality of lights 14 may be a plurality of light emitting diodes (LEDs) connected together by a wire 16. The plurality of lights 14 may be attached to the inner surface of the panel frame 28 by an adhesive 46, such as double sided tape or glue. The lights 14 may therefore surround the support rod 22 and emit light on the mirrored outer surface 12. The wiring 16 of the lights 14 may be attached to the inner surface in a wave format to cover more surface area and to further surround the support rod 22. In certain embodiments, the inner surface of the panel frame 28 may be a mirrored inner surface 11. The mirrored surfaces 11, 12 may be a vinyl mirroring attached by an adhesive 26.

In certain embodiments, the present invention may include more than one support rod 22. As illustrated in the Figures, the present invention may include two support rod 22. The support rod 22 may each include a top end and a bottom end. The top ends and bottom ends may be mounted to the frames 28, 34 through aligned openings 38 and using mounting brackets 24. The top ends may be attached to a top portion of the frames 28, 34 and the bottom ends may be attached to a bottom portion of the frames 28, 34. As illustrated in the Figures, the support rod 22 may thereby be oriented in a vertical position. However, the support rod 22 may be arranged in a horizontal position, spanning from a right side to a left side.

The solar panel 42 of the present invention may be mounted to a top portion of the outer frame 34 and may be directed towards the sun. The present invention may also include an electrical box 44 which contains all of the electronics involved in the operation of the sign 10. The electrical box 44 may contain a charge controller 72, a battery 48, and a photocell or timer 70. Wiring 16 may run from the electrical box 44 and into the internal housing through a grommet 36 and opening 40 formed in the frames 28, 34. A positive wire 64 and a negative wire 66 may run from the solar panel 42 to the charge controller 72. A one way diode 68 may prevent electricity from flowing back to the solar panel 42. From the charge controller 72, a positive wire 62 and a negative wire 60 may run to the battery 48. From the battery 48 a positive wire 58 and a negative wire 56 may run to the photocell or timer 70. A fuse 74 may be attached to the positive wire 58. Further, a negative wire 52 may run directly from the negative wire 56 to the LED modules 50. From the photocell or timer 70, a positive wire 54 may run to the LED modules 50. In alternative embodiments, the present invention may include a positive wire 78 and a negative wire 76 running from the controller to the LED modules 50 where a photocell or timer 70 is not used.

In operation, the solar panel 42 may receive sunlight and generate electrical energy. The electrical energy may travel to the charge controller 72 via the wires 64, 66 and may travel to the battery 48 via wires 60, 62 so that the energy may be stored. A photocell or timer 70 may be used to determine when to power the LED module 50, which in turn powers the lights 14. For example, when the photocell 70 detects dim light or no light, the battery 48 may power the LED module 50. When light is detected, the LED module 50 may be powered off to conserve energy. Alternatively, using a timer 70, once a certain time has been reached, the battery may power or shut off the LED module 50. Once the lights 14 are turned on, the light is emitted towards the reflective mirrored surfaces 11, 12, which may brighten the inner housing. The light may pass through the translucent panels 18, which in turn brightens the sign 10. Utilizing the mirrored surfaces 11, 12 allows for minimal power to be used, with enough light produces for the signs 10 to be effective. Since minimal power is needed, solar energy may be used to power the sign 10.

It should be understood, of course, that the foregoing relates to exemplary embodiments of the invention and that modifications may be made without departing from the spirit and scope of the invention as set forth in the following claims.

What is claimed is:

1. A solar powered sign comprising:
    a panel frame comprising an outer surface, an inner surface forming an inner housing, and at least one rim forming an opening into the inner housing, wherein the inner surface of the panel frame comprises a mirrored surface;
    a translucent panel covering the opening of the panel frame;
    at least one support rod comprising a mirrored outer surface disposed within the inner housing;
    a plurality of lights attached to the inner surface of the panel frame and operable to emit light towards the mirrored surface; and
    a solar panel electrically powering the plurality of lights.

2. The solar powered sign of claim 1, wherein the translucent panel comprises a text or design forming a translucent sign.

3. The solar powered sign of claim 1, wherein the at least one rim comprises a front rim and a rear rim, and wherein a first translucent panel is attached to the front rim and a second translucent panel is attached to the rear rim.

4. The solar powered sign of claim 1, wherein the plurality of lights is a plurality of light emitting diodes.

5. The solar powered sign of claim 1, wherein the at least one support rod is two support rods, wherein each of the two support rods comprises a bottom end mounted to a bottom portion of the panel frame, and a top end mounted to a top portion of the panel frame.

6. The solar powered sign of claim 1, further comprising an outer frame, wherein the panel frame is secured within the outer frame.

7. The solar powered sign of claim 6, wherein the solar panel is mounted to a top portion of the outer frame.

8. The solar powered sign of claim 1, further comprising an acrylic sheet covering the opening and aligned with the translucent panel.

9. The solar powered sign of claim 1, further comprising at least one of a photo cell and a timer operable to turn the plurality of lights on and off.

10. The solar powered sign of claim 1, further comprising a battery operable to store energy captured by the solar panel.

11. The solar powered sign of claim 10, further comprising a controller, wherein wiring connects the solar panel to the controller, and the controller to the battery via electric wiring.

12. The solar power sign of claim 11, further comprising a one way diode attached to the wiring in between the solar panel and the controller.

* * * * *